United States Patent
Huang et al.

(10) Patent No.: US 11,150,286 B2
(45) Date of Patent: Oct. 19, 2021

(54) WIRELESS PASSIVE PROBE

(71) Applicant: Sichuan University, Sichuan (CN)

(72) Inventors: Kama Huang, Sichuan (CN); Yang Yang, Sichuan (CN); Huacheng Zhu, Sichuan (CN); Xing Chen, Sichuan (CN); Changjun Liu, Sichuan (CN)

(73) Assignee: Sichuan University, Sichuan (CN)

( * ) Notice: Subject to any disclaimer, the term of this patent is extended or adjusted under 35 U.S.C. 154(b) by 143 days.

(21) Appl. No.: 16/699,607

(22) Filed: Nov. 30, 2019

(65) Prior Publication Data

US 2020/0103449 A1    Apr. 2, 2020

(30) Foreign Application Priority Data

Jan. 19, 2019 (CN) .......................... 201910050490.9

(51) Int. Cl.
   *G01R 29/08* (2006.01)
(52) U.S. Cl.
   CPC ................................ *G01R 29/0878* (2013.01)
(58) Field of Classification Search
   CPC  G01R 29/0878; G01R 33/3692; G01R 23/00; G01R 33/32
   USPC ................................................. 324/623, 637
   See application file for complete search history.

(56) References Cited

U.S. PATENT DOCUMENTS

| | | | | |
|---|---|---|---|---|
| 6,806,650 B2 * | 10/2004 | Johnson | ............. | G01R 19/0053 315/111.21 |
| 7,040,139 B2 * | 5/2006 | Sunshine | ............. | G01N 29/022 340/10.1 |
| 7,086,593 B2 * | 8/2006 | Woodard | ............. | B60C 23/0449 235/435 |
| 7,159,774 B2 * | 1/2007 | Woodard | ............. | B60C 23/0449 235/449 |
| 7,201,035 B2 * | 4/2007 | Sunshine | ............. | G01N 29/022 340/10.1 |
| 7,387,010 B2 * | 6/2008 | Sunshine | ............. | G01N 29/022 340/10.1 |
| 8,400,168 B2 * | 3/2013 | Troxler | ................. | G01N 22/04 324/663 |
| 8,405,405 B2 * | 3/2013 | Tsironis | ............. | G01R 29/0878 324/638 |
| 8,841,921 B1 * | 9/2014 | Tsironis | ............. | G01R 1/06772 324/601 |

(Continued)

*Primary Examiner* — Jermele M Hollington
*Assistant Examiner* — Sean Curtis

(57) ABSTRACT

A wireless passive probe solves problems such as the measurement accuracy of the field strength detecting device in the prior art is affected by the communication device and the system structure is complicated, which includes a probe for collecting data in the field to be measured; wherein the wireless passive probe further comprises: a wireless transmission module, an antenna module, sensors, and a microprocessor. The wireless passive probe of the present invention transmits position temperature, field strength, moisture, air pressure probe serial numbers and the coordinate signals of the probe in real time through the wireless transmission module, and provides the power supply to the communication module through detecting or receiving microwave signals through the antenna, thereby avoiding inaccurate wireless measurement of the probe field caused by the field to be tested which is not tightly sealed and the cable.

20 Claims, 1 Drawing Sheet

(56) References Cited

U.S. PATENT DOCUMENTS

| | | | | |
|---|---|---|---|---|
| 8,847,609 B2* | 9/2014 | Troxler | G01N 33/42 | 324/643 |
| 8,963,560 B2* | 2/2015 | Mertel | G01R 29/0878 | 324/629 |
| 9,893,715 B2* | 2/2018 | Zachara | H01Q 1/22 | |
| 9,921,256 B2* | 3/2018 | Corum | G01R 29/12 | |
| 9,927,477 B1* | 3/2018 | Lilly | G01R 29/0878 | |
| 10,264,528 B2* | 4/2019 | Kato | H02J 50/80 | |
| 10,274,527 B2* | 4/2019 | Corum | H01Q 13/26 | |
| 10,348,272 B2* | 7/2019 | Zachara | H03J 3/02 | |
| 2003/0052664 A1* | 3/2003 | Johnson | G01R 19/0053 | 324/96 |
| 2005/0007239 A1* | 1/2005 | Woodard | G01L 19/086 | 340/10.2 |
| 2005/0022581 A1* | 2/2005 | Sunshine | G01N 33/0073 | 73/31.05 |
| 2006/0124740 A1* | 6/2006 | Woodard | G01L 19/086 | 235/449 |
| 2006/0144123 A1* | 7/2006 | Sunshine | H04Q 9/00 | 73/23.2 |
| 2007/0180892 A1* | 8/2007 | Sunshine | G01N 33/0073 | 73/24.01 |
| 2011/0204906 A1* | 8/2011 | Tsironis | G01R 27/32 | 324/750.01 |
| 2013/0043885 A1* | 2/2013 | Mertel | G01R 29/0878 | 324/629 |
| 2014/0009170 A1* | 1/2014 | Troxler | G01N 22/04 | 324/637 |
| 2015/0162897 A1* | 6/2015 | Zachara | H01Q 9/145 | 455/77 |
| 2016/0344094 A1* | 11/2016 | Singh | A61N 1/3787 | |
| 2017/0067951 A1* | 3/2017 | Corum | G01R 29/0871 | |
| 2017/0181087 A1* | 6/2017 | Kato | H02J 7/00034 | |
| 2017/0301994 A1* | 10/2017 | Dudley | H01Q 9/27 | |
| 2018/0106845 A1* | 4/2018 | Corum | G01V 3/12 | |
| 2018/0269857 A1* | 9/2018 | Zachara | H01Q 1/22 | |
| 2020/0045782 A1* | 2/2020 | Lindberg-Poulsen | H05B 6/6447 | |
| 2020/0103449 A1* | 4/2020 | Huang | G01R 29/0878 | |
| 2020/0103450 A1* | 4/2020 | Yang | G01R 29/0871 | |
| 2020/0119437 A1* | 4/2020 | Singh | H04B 5/0068 | |
| 2020/0195233 A1* | 6/2020 | Zachara | H01Q 9/145 | |
| 2021/0135348 A1* | 5/2021 | Singh | H01F 41/041 | |
| 2021/0143681 A1* | 5/2021 | Farkas | H02J 50/40 | |

* cited by examiner

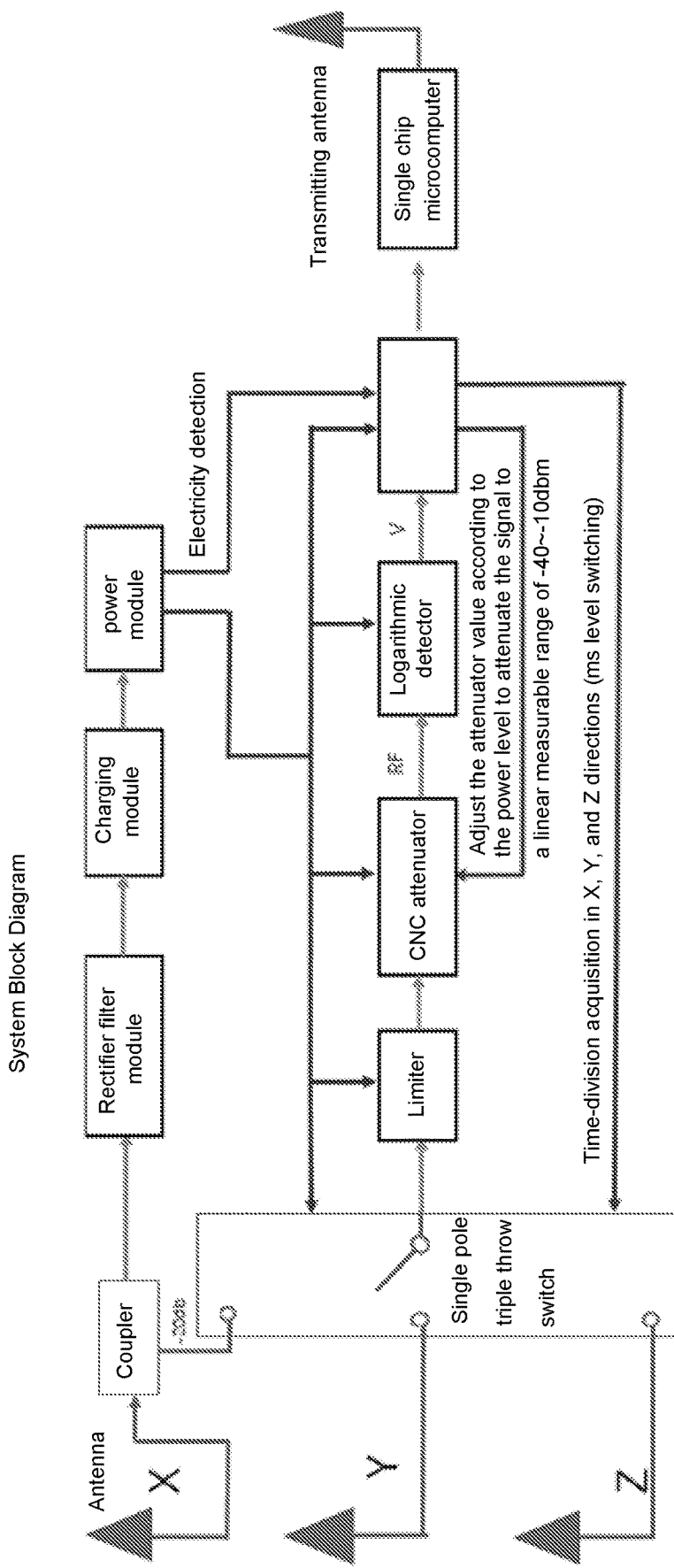

WIRELESS PASSIVE PROBE

CROSS REFERENCE OF RELATED APPLICATION

The present invention claims priority under 35 U.S.C. 119(a-d) to CN 201910050490.9, filed Jan. 19, 2019.

BACKGROUND OF THE PRESENT INVENTION

Field of Invention

The present invention relates to microwave field measurement, and more particularly to a wireless passive probe.

Description of Related Arts

In microwave energy industrial applications, whether uniform heating or not can directly affect the processing performance of the material being heated. The uniformity of heating depends, on the one hand, on the physical and chemical properties of the material's dielectric properties, and on the other hand, on the electric field distribution in the heating chamber.

Conventionally, the uniformity of heating is mostly characterized by the distribution of the temperature field of the heated material. There is still no literature to analyze the uniformity of the heating chamber from the direct detection of the electromagnetic field distribution in the cavity. In order to detect the electric field distribution in a specific cavity, a special field strength probe is needed to detect the relative strength of the electric field. The probes that accurately measure field strength on the market are expensive (6-10 W) and have a small dynamic range (<1000V/m), which is not suitable for the detection of field strength uniformity in high-power heating chambers.

Chinese patent application CN 201410829902.6 disclosed a fiber-optic field-strength sensor which reduces the size of the sensor probe to improve the detection accuracy. The field strength is measured and transmitted through the optical fiber. Chinese patent application CN 201410829956.2 disclosed an automatic calibration method for field strength distribution characteristics of electromagnetic reverberation chamber, which uses eight field strength probes to obtain the real-time measurement of the field intensity distribution in the electromagnetic reverberation chamber to achieve the calibration of the spatial field distribution characteristics, but the optical fiber will affect the accuracy of the field strength measurement, and will affect the tightness of the field to be tested.

Chinese patent application CN 201010178527.5 disclosed a wide-band signal transmission system based on wireless transmission in a high-potential environment. The sensor and wireless transmission system measure and transmit physical quantities such as voltage, current, electromagnetic field and temperature under high-potential field, and use a battery as energy supply to the wireless transmission system. However, there are problems such as battery exhaustion and influence of the transmission system signal on influence factors of the field signal.

SUMMARY OF THE PRESENT INVENTION

An object of the present invention is to provide a wireless passive probe to solve problems such as the measurement accuracy of the field strength detecting device in the prior art is affected by the communication device and the system structure is complicated.

Accordingly, in order to accomplish the above object, the present invention provides a wireless passive probe placed in a field to be measured, comprising: a probe for collecting data in the field to be measured; wherein the wireless passive probe further comprises: a wireless transmission module, an antenna module, sensors, and a microprocessor;

wherein the wireless transmission module, the antenna module, and the sensors are respectively connected to the microprocessor;

wherein the antenna module comprises a receiving antenna which collects radio frequency microwave signals; a frequency of the receiving antenna is different from a frequency of the field to be measured, and is not a harmonic of the frequency of the field to be measured.

Preferably, the wireless transmission module comprises a power supply unit, and a field patch antenna unit for receiving packaged data, probe serial numbers, and coordinate signals; wherein the power supply unit is connected to the receiving antenna.

Preferably, the receiving antenna is a monopole antenna connected to a detection module.

Preferably, the receiving antenna is connected to a rectifier and the power supply unit.

Preferably, the antenna module comprises a transmitting antenna connected to the wireless transmission module, wherein the transmitting antenna is disposed on a container of the field to be measured through a cut-off hole.

Preferably, the sensors comprise a monopole antenna sensing a field strength to be measured, a capacitive moisture sensor, a barometric sensor chip, and a temperature sensor; wherein the sensors are respectively connected to the microprocessor.

Preferably, the capacitive moisture sensor is a multivibrator formed by a 555 chip for detecting a capacitance.

Preferably, the microprocessor is a single chip microcomputer.

The wireless passive probe of the present invention transmits position temperature, field strength, moisture, air pressure probe serial numbers and the coordinate signals of the probe in real time through the wireless transmission module, and provides the power supply to the communication module through detecting or receiving microwave signals through the antenna, thereby avoiding inaccurate wireless measurement of the probe field caused by the field to be tested which is not tightly sealed and the cable.

BRIEF DESCRIPTION OF THE DRAWINGS

In order to more clearly illustrate the embodiments of the present invention or the technical solutions in the prior art, the drawings used in the embodiments or the description of the prior art will be briefly described below. Obviously, the drawings in the following description only refer to a certain embodiment of the present invention, and other drawings can be obtained by those skilled in the art without any inventive labor.

FIGURE is a system block diagram of the present invention.

DETAILED DESCRIPTION OF THE PREFERRED EMBODIMENT

The technical solutions in the embodiments of the present invention are clearly and completely described in the following with reference to the accompanying drawings of the embodiments of the present invention. It is obvious that the described embodiments are only a part of the embodiments of the present invention, but not all embodiments. All other embodiments obtained by those skilled in the art based on the embodiments of the present invention without creative efforts are within the scope of the present invention.

Referring to FIGURE, the present invention provides a wireless passive probe placed in a field to be measured, comprising: a probe for collecting data in the field to be measured; wherein the wireless passive probe further comprises: a wireless transmission module, an antenna module, sensors, and a microprocessor; wherein the wireless transmission module, the antenna module, and the sensors are respectively connected to the microprocessor; wherein the antenna module comprises a receiving antenna which collects radio frequency microwave signals; a frequency of the receiving antenna is different from a frequency of the field to be measured, and is not a harmonic of the frequency of the field to be measured.

Preferably, the wireless transmission module comprises a power supply unit, and a field patch antenna unit for receiving packaged data, probe serial numbers, and coordinate signals; wherein the power supply unit is connected to the receiving antenna.

Preferably, the receiving antenna is a monopole antenna connected to a detection module. Preferably, the receiving antenna is connected to a rectifier and the power supply unit.

Preferably, the antenna module comprises a transmitting antenna connected to the wireless transmission module, wherein the transmitting antenna is disposed on a container of the field to be measured through a cut-off hole.

Preferably, the sensors comprise a monopole antenna sensing a field strength to be measured, a capacitive moisture sensor, a barometric sensor chip, and a temperature sensor; wherein the sensors are respectively connected to the microprocessor. Preferably, the capacitive moisture sensor is a multi-vibrator formed by a 555 chip for detecting a capacitance. The barometric sensor chip is MPX4105, which works at +5V voltage, and converts the measured voltage into output voltage and sends it to a single-chip analog-to-digital conversion circuit. A resistor R5 and a capacitor C7 form a typical decoupling filter circuit. Preferably, the microprocessor is a single chip microcomputer.

A plurality of probes is set through polyethylene tetrafluoro brackets, so as to obtain the real-time electric field distribution of the field to be measured.

Embodiment

Through a receiving antenna for collecting radio frequency microwave signals, the receiving antenna is connected to the power supply unit through a rectifier, so as to provide energy for the probe wireless transmission module.

Alternatively, the detecting device and the A/D conversion module process the signals. Meanwhile, the detection device is connected to a switch which can be switched between a 2.45 GHz single-pole four-throw switch or a 433 MHz single-pole single-throw switch to provide energy for the wireless transmission module.

The monopole antennas in the X/Y/Z axis directions receive the electric field signals in each direction at a certain position. The detecting device and the A/D conversion module process the signals. The single chip microcomputer calculates the vector electric field at the position.

The measured moisture is converted into a capacitance by a capacitive moisture sensor, and the detection capacitance is detected by a multi-vibrator composed of a 555 chip.

Through the barometric sensor chip MPX4105, the measured voltage is converted into an output voltage and sent to the single chip microcomputer for analog-to-digital conversion.

The collected temperature data is transmitted to the single chip microcomputer through the temperature sensor, The single-chip microcomputer receives the electric field signal, the moisture signal, the barometric signal and the temperature signal of the sensors in various directions of the position, and wirelessly transmits the packaged temperature, the probe serial numbers and the coordinate signals through the wireless transmission module to obtain a real-time electric field at the location.

A plurality of probes is set through polyethylene tetrafluoro brackets, so as to obtain the real-time electric field distribution of the field to be measured.

The antenna module comprises a transmitting antenna connected to the wireless transmission module, wherein the transmitting antenna is disposed on a container of the field to be measured through a cut-off hole.

The wireless passive probe of the present invention transmits position temperature, field strength, moisture, air pressure probe serial numbers and the coordinate signals of the probe in real time through the wireless transmission module, and provides the power supply to the communication module through detecting or receiving microwave signals through the antenna, thereby avoiding inaccurate wireless measurement of the probe field caused by the field to be tested which is not tightly sealed and the cable.

Of course, those skilled in the art should be able to make various changes and modifications in accordance with the present invention without departing from the spirit and scope of the invention, such changes and modifications are within the scope of protection of the claims.

What is claimed is:

1. A wireless passive probe placed in a field to be measured, comprising: a probe for collecting data in the field to be measured; wherein the wireless passive probe further comprises: a wireless transmission module, an antenna module, sensors, and a microprocessor;
   wherein the wireless transmission module, the antenna module, and the sensors are respectively connected to the microprocessor;
   wherein the antenna module comprises a receiving antenna which collects radio frequency microwave signals; a frequency of the receiving antenna is different from a frequency of the field to be measured, and is not a harmonic of the frequency of the field to be measured.

2. The wireless passive probe, as recited in claim 1, wherein the wireless transmission module comprises a power supply unit, and a field patch antenna unit for receiving packaged data, probe serial numbers, and coordinate signals; wherein the power supply unit is connected to the receiving antenna.

3. The wireless passive probe, as recited in claim 2, wherein the receiving antenna is a monopole antenna connected to a detection module.

4. The wireless passive probe, as recited in claim 2, wherein the receiving antenna is connected to a rectifier and the power supply unit.

5. The wireless passive probe, as recited in claim 1, wherein the antenna module comprises a transmitting antenna connected to the wireless transmission module, wherein the transmitting antenna is disposed on a container of the field to be measured through a cut-off hole.

6. The wireless passive probe, as recited in claim 2, wherein the antenna module comprises a transmitting antenna connected to the wireless transmission module, wherein the transmitting antenna is disposed on a container of the field to be measured through a cut-off hole.

7. The wireless passive probe, as recited in claim 3, wherein the antenna module comprises a transmitting antenna connected to the wireless transmission module, wherein the transmitting antenna is disposed on a container of the field to be measured through a cut-off hole.

8. The wireless passive probe, as recited in claim 4, wherein the antenna module comprises a transmitting antenna connected to the wireless transmission module, wherein the transmitting antenna is disposed on a container of the field to be measured through a cut-off hole.

9. The wireless passive probe, as recited in claim 5, wherein the sensors comprise a monopole antenna sensing a field strength to be measured, a capacitive moisture sensor, a barometric sensor chip, and a temperature sensor; wherein the sensors are respectively connected to the microprocessor.

10. The wireless passive probe, as recited in claim 6, wherein the sensors comprise a monopole antenna sensing a field strength to be measured, a capacitive moisture sensor, a barometric sensor chip, and a temperature sensor; wherein the sensors are respectively connected to the microprocessor.

11. The wireless passive probe, as recited in claim 7, wherein the sensors comprise a monopole antenna sensing a field strength to be measured, a capacitive moisture sensor, a barometric sensor chip, and a temperature sensor; wherein the sensors are respectively connected to the microprocessor.

12. The wireless passive probe, as recited in claim 8, wherein the sensors comprise a monopole antenna sensing a field strength to be measured, a capacitive moisture sensor, a barometric sensor chip, and a temperature sensor; wherein the sensors are respectively connected to the microprocessor.

13. The wireless passive probe, as recited in claim 9, wherein the capacitive moisture sensor is a multi-vibrator formed by a 555 chip for detecting a capacitance.

14. The wireless passive probe, as recited in claim 10, wherein the capacitive moisture sensor is a multi-vibrator formed by a 555 chip for detecting a capacitance.

15. The wireless passive probe, as recited in claim 11, wherein the capacitive moisture sensor is a multi-vibrator formed by a 555 chip for detecting a capacitance.

16. The wireless passive probe, as recited in claim 12, wherein the capacitive moisture sensor is a multi-vibrator formed by a 555 chip for detecting a capacitance.

17. The wireless passive probe, as recited in claim 13, wherein the microprocessor is a single chip microcomputer.

18. The wireless passive probe, as recited in claim 14, wherein the microprocessor is a single chip microcomputer.

19. The wireless passive probe, as recited in claim 15, wherein the microprocessor is a single chip microcomputer.

20. The wireless passive probe, as recited in claim 16, wherein the microprocessor is a single chip microcomputer.

* * * * *